(12) United States Patent
Han (10) Patent No.: US 10,930,824 B2
(45) Date of Patent: Feb. 23, 2021

(54) LIGHT EMITTING DEVICE

(71) Applicant: Seoul Semiconductor Co., Ltd., Ansan-si (KR)

(72) Inventor: Bo Yong Han, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 54 days.

(21) Appl. No.: 16/366,735

(22) Filed: Mar. 27, 2019

(65) Prior Publication Data
US 2019/0305192 A1    Oct. 3, 2019

Related U.S. Application Data

(60) Provisional application No. 62/648,454, filed on Mar. 27, 2018.

(51) Int. Cl.
| | |
|---|---|
| *H01L 33/50* | (2010.01) |
| *H01L 25/13* | (2006.01) |
| *H01L 33/62* | (2010.01) |
| *H01L 33/54* | (2010.01) |
| *H01L 33/48* | (2010.01) |

(52) U.S. Cl.
CPC ............ *H01L 33/504* (2013.01); *H01L 25/13* (2013.01); *H01L 33/502* (2013.01); *H01L 33/483* (2013.01); *H01L 33/507* (2013.01); *H01L 33/54* (2013.01); *H01L 33/62* (2013.01)

(58) Field of Classification Search
CPC .... F21K 9/00; F21K 9/64; F21K 99/00; F21S 2/00; F21V 19/042; F21V 19/045; H01L 25/0753; H01L 25/13; H01L 33/50–508
See application file for complete search history.

(56) References Cited

U.S. PATENT DOCUMENTS

| | | | |
|---|---|---|---|
| 9,343,635 B2 | 5/2016 | Kim et al. | |
| 2004/0056256 A1* | 3/2004 | Bokor | .................. C09K 11/665 |
| | | | 257/79 |
| 2014/0265921 A1 | 9/2014 | Collins | |
| 2015/0155449 A1 | 6/2015 | Kim et al. | |

(Continued)

FOREIGN PATENT DOCUMENTS

| | | |
|---|---|---|
| KR | 10-2010-0051476 | 5/2010 |
| KR | 10-2013-0016815 | 2/2013 |
| KR | 10-1440232 | 7/2014 |

(Continued)

*Primary Examiner* — Daniel P Shook
(74) *Attorney, Agent, or Firm* — H.C. Park & Associates, PLC (57) ABSTRACT

A light emitting device including a blue light emitting portion configured to emit blue light, a green light emitting portion configured to emit green light, and a red light emitting portion configured to emit red light, in which the blue light emitting portion includes a near-UV light emitting diode chip and a first wavelength conversion portion for wavelength conversion of near-UV light emitted from the near-UV light emitting diode chip, the blue light emitted from the blue light emitting portion includes a first peak wavelength in a wavelength band corresponding to near-UV light and a second peak wavelength in a wavelength band corresponding to blue light, and an intensity of the first peak wavelength is in a range of 0% to 20% of an intensity of the second peak wavelength.

20 Claims, 10 Drawing Sheets

(56) References Cited

U.S. PATENT DOCUMENTS

2017/0238390 A1\* 8/2017 Yamakawa ............ H05B 47/16
                                                          315/294
2019/0013446 A1   1/2019 Byun et al.

FOREIGN PATENT DOCUMENTS

KR   10-2015-0051780   5/2015
KR   10-2017-0077679   7/2017

\* cited by examiner

LIGHT EMITTING DEVICE

CROSS-REFERENCE TO RELATED APPLICATION

This application claims priority from and the benefit of U.S. Provisional Application No. 62/648,454, filed on Mar. 27, 2018, which is incorporated by reference for all purposes as if fully set forth herein.

FIELD

Exemplary embodiments of the invention relate to a light emitting device and, more particularly, to a light emitting device that can be used in a lighting fixture with a light emitting diode as a light source.

DISCUSSION OF THE BACKGROUND

Most life on earth has adapted to work in tune with the sun. The human body has also adapted to sunlight over a long period of time. Accordingly, human biorhythm is known to change with the change of sunlight. More particularly, in the morning, cortisol is secreted from the human body under the bright sunlight. Cortisol causes more blood to be supplied to the organs of the body to increase the pulse and respiration in response to external stimulus, such as stress, thereby causing the body to be awaken and be prepared for daytime activity. After active physical activity under the active sunlight during the daytime, the body secretes melatonin in the evening to reduce the pulse, body temperature, and blood pressure of the body, thereby assisting in resting and sleeping.

In modern society, however, most people mainly perform physical activities at home or office instead of under sunlight. For example, it is common for many people to spend a greater amount of time indoors, rather than under sunlight, at around noon.

The above information disclosed in this Background section is only for understanding of the background of the inventive concepts, and, therefore, it may contain information that does not constitute prior art.

SUMMARY

Light emitting device constructed according to exemplary embodiments of the invention are capable of realizing a spectral power distribution close to the spectral power distribution of sunlight to which the human body is adapted.

Exemplary embodiments also provide a light emitting device capable of changing the spectral power distribution of light emitted therefrom.

Additional features of the inventive concepts will be set forth in the description which follows, and in part will be apparent from the description, or may be learned by practice of the inventive concepts.

A light emitting device according to an exemplary embodiment includes a blue light emitting portion configured to emit blue light, a green light emitting portion configured to emit green light, and a red light emitting portion configured to emit red light, in which the blue light emitting portion includes a near-UV light emitting diode chip and a first wavelength conversion portion for wavelength conversion of near-UV light emitted from the near-UV light emitting diode chip, the blue light emitted from the blue light emitting portion includes a first peak wavelength in a wavelength band corresponding to near-UV light and a second peak wavelength in a wavelength band corresponding to blue light, and an intensity of the first peak wavelength is in a range of 0% to 20% of an intensity of the second peak wavelength.

The blue light emitting portion may include a housing, the near-UV light emitting diode chip mounted on the housing, and the first wavelength conversion portion covering the near-UV light emitting diode chip, the first wavelength conversion portion including at least one type of phosphor to emit blue light through wavelength conversion of near-UV light emitted from the near-UV light emitting diode chip.

The phosphor may include at least one of $BaMgAl_{10}O_{17}$:$Mn^{2+}$, $BaMgAl_{12}O_{19}$:$Mn^{2+}$, and $Sr,Ca,Ba(PO_4)Cl$:$Eu^{2+}$.

The green light emitting portion may include a housing, a near-UV light emitting diode chip or a blue light emitting diode chip mounted on the housing, and a second wavelength conversion portion covering the near-UV light emitting diode chip or blue light emitting diode chip, the second wavelength conversion portion including at least type of phosphor to emit green light through wavelength conversion of light emitted from the near-UV light emitting diode chip or blue light emitting diode chip.

The green light emitted from the green light emitting portion may include a third peak wavelength in a wavelength band corresponding to near-UV light or blue light, and a fourth peak wavelength in a wavelength band corresponding to green light, and an intensity of the third peak wavelength may be in a range of 0% to 20% of an intensity of the fourth peak wavelength.

The phosphor may include at least one of LuAG ($Lu_3(Al,Gd)_5O_{12}$:$Ce^{3+}$), YAG ($Y_3(Al,Gd)_5O_{12}$:$Ce^{3+}$), Ga-LuAG (($Lu,Ga)_3(Al,Gd)_5O_{12}$:$Ce^{3+}$, Ga-YAG (($Ga,Y)_3(Al,Gd)_5O_{12}$:$Ce^{3+}$), LuYAG (($Lu,Y)_3(Al,Gd)_5O_{12}$:$Ce^{3+}$), orthosilicate (($Sr,Ba,Ca,Mg)_2SiO_4$:$Eu^{2+}$), oxynitride (($Ba,Sr,Ca)Si_2O_2N_2$:$Eu^{2+}$), and thiogallate ($SrGa_2S_4$:$Eu^{2+}$).

The red light emitting portion may include a housing, a near-UV light emitting diode chip or a blue light emitting diode chip mounted on the housing, and a third wavelength conversion portion covering the near-UV light emitting diode chip or blue light emitting diode chip, the third wavelength conversion portion including at least one type of phosphor to emit red light through wavelength conversion of light emitted from the near-UV light emitting diode chip or blue light emitting diode chip.

The red light emitted from the red light emitting portion may include a fifth peak wavelength in a wavelength band corresponding to near-UV light or blue light and a sixth peak wavelength in a wavelength band corresponding to red light, and an intensity of the fifth peak wavelength may be in a range of 0% to 20% of an intensity of the sixth peak wavelength.

The phosphor may include at least one of CASN ($CaAlSiN_3$:$Eu^{2+}$), oxynitride (($Ba,Sr,Ca)_2Si_5N_8$:$Eu^{2+}$), sulfide ($(Ca,Sr)S_2$:$Eu^{2+}$), and thiosilicate (($Sr,Ca)_2SiS_4$:$Eu^{2+}$).

A triangular region defined by color coordinates of the blue light emitting portion, the green light emitting portion, and the red light emitting portion may include at least some part of the Planckian locus therein, the highest color temperature on the Planckian locus in the triangular region may be 5,000 K, and the lowest color temperature on the Planckian locus in is the triangular region may be 3,000 K or less.

The highest color temperature may be 6,000 K or more, and the lowest color temperature may be 2,700 K or less.

The highest color temperature may be 6,500 K or more.

The highest color temperature may be 6,500 K or more, and the lowest color temperature may be 1,800 K or less.

The green light emitted from the green light emitting portion may include a third peak wavelength in a wavelength band corresponding to near-UV light or blue light and a fourth peak wavelength in a wavelength band corresponding to green light, the red light emitted from the red light emitting portion may include a fifth peak wavelength in a wavelength band corresponding to near-UV light or blue light and a sixth peak wavelength in a wavelength band corresponding to red light, an intensity of the third peak wavelength may be in a range of 0% to 20% of an intensity of the fourth peak wavelength, and an intensity of the fifth peak wavelength may be in a range of 0% to 20% of an intensity of the sixth peak wavelength.

Each of the blue light emitting portion, green light emitting portion, and red light emitting portion may be formed in plural.

The light emitting device may further include a base, in which each of the blue, green, and red light emitting portions may be arranged on the base.

The light emitting device may further include an integrated circuit (IC) disposed on the base.

The light emitting device may be configured to emit light based on spectrum information of sunlight stored in a database.

The light emitting device may further include a timer, in which the light emitting device may be configured to emit light based on the stored spectrum information of sunlight according to time of the timer.

The light emitting device may be configured to be controlled by a user interface. It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

In general, indoor lighting devices exhibit a constant spectral power distribution, which is significantly different from the spectral power distribution of sunlight.

Figure 1:
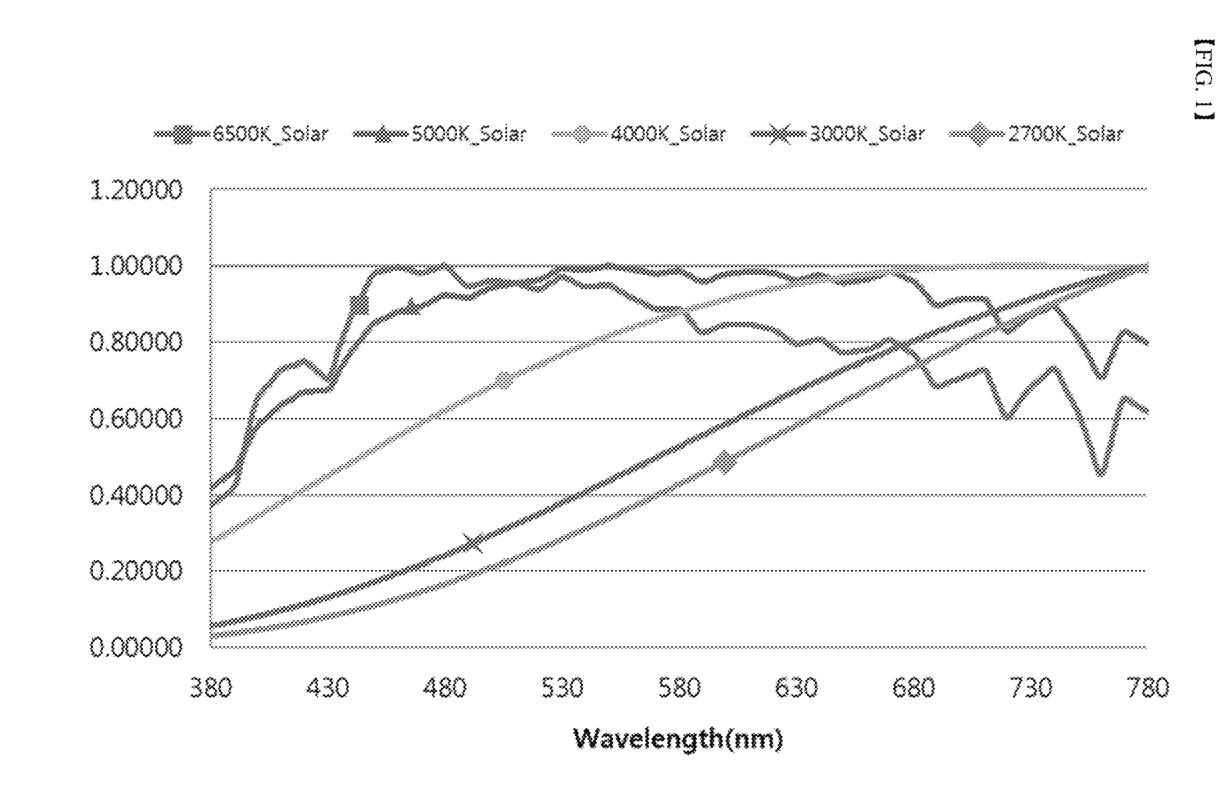
FIG. 1 is a graph depicting a spectral power distribution according to color temperature of sunlight.
Figure 2:
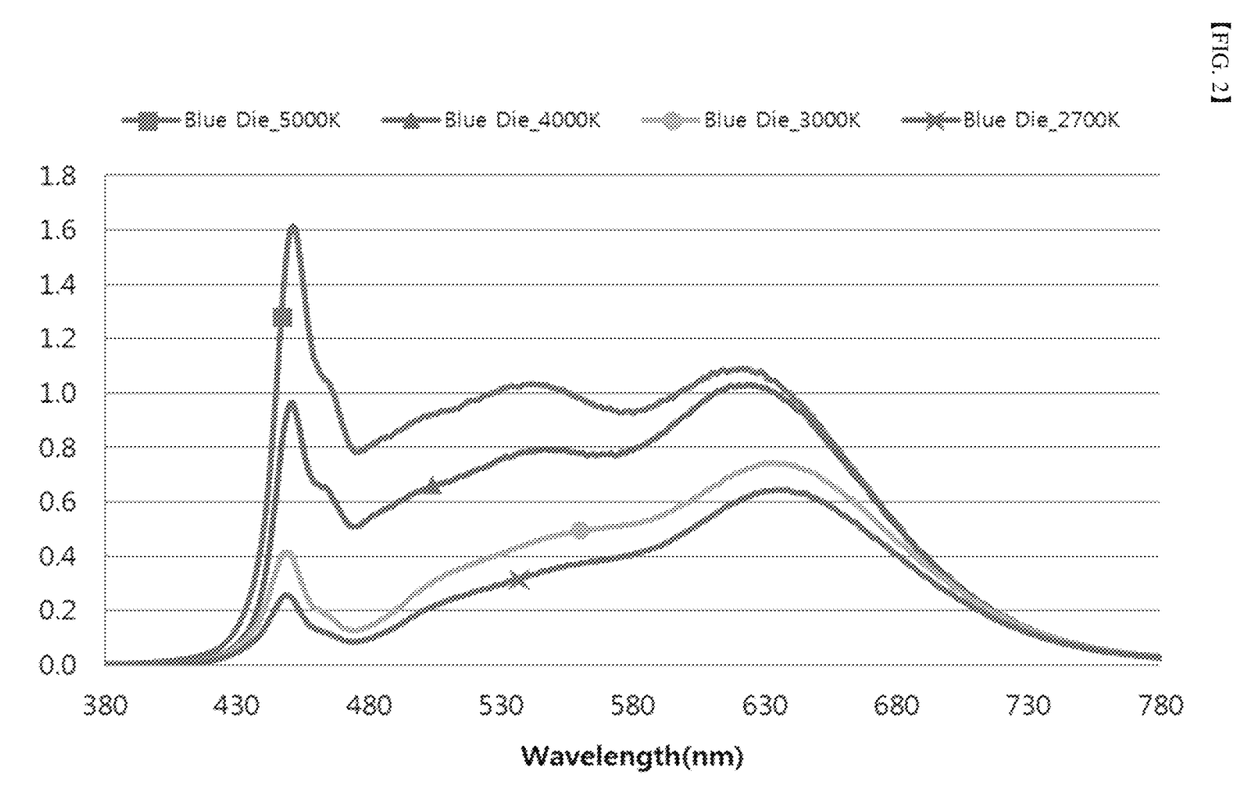
FIG. 2 is a graph depicting a spectral power distribution of light emitted from a white light emitting device using a conventional blue light emitting diode chip.
Figure 3:
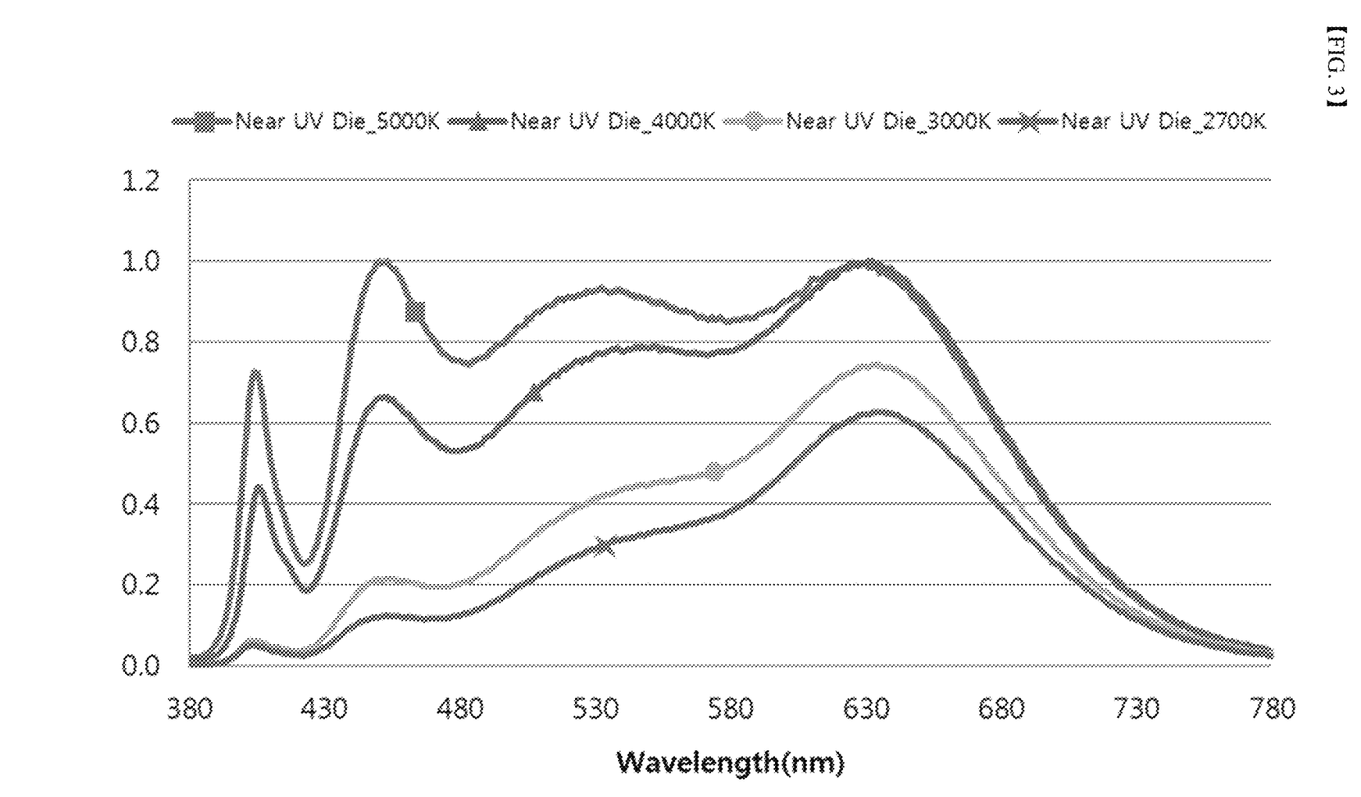
FIG. 3 is a graph depicting a spectral power distribution of light emitted from a white light emitting device using a conventional near-UV light emitting diode chip.

FIG. 1 is a graph depicting a spectral power distribution according to color temperature of sunlight, and FIG. 2 is a graph depicting a spectral power distribution of light emitted from a white light emitting device using a conventional blue light emitting diode chip. FIG. 3 is a graph depicting a spectral power distribution of light emitted from a white light emitting device using a conventional near-UV light emitting diode chip.

A white light emitting device using a blue light emitting diode chip exhibits the color temperature-related spectral power distribution, as shown in FIG. 2. The white light emitting device using the blue light emitting diode chip exhibits a substantially uniform spectral power distribution in the overall wavelength region. However, high peaks in the wavelength region corresponding to blue light are observed due to realization of white light based on the blue light emitting diode. The white light emitting device using a blue light emitting diode chip emits white light through wavelength conversion of a fraction of light emitted from the blue light emitting diode chip.

When the blue light emitting diode chip is used to display white light, the white light emitting device exhibits high peaks in the blue wavelength band, which may damage retinal cells in the human lens, and affects the secretion of cortisol or melatonin in the human body, thereby causing a high risk of mental disorder, such as insomnia or bipolar disorder. In addition, blue light causes the metabolism of the human body to become unbalanced, thereby causing adult diseases, such as obesity and diabetes.

A white light emitting device using a near-UV light emitting diode chip exhibits a spectral power distribution as shown in FIG. 3. As used herein, "near-UV light" refers to short-wavelength visible light close to UV light, and a near-UV light emitting diode chip refers to a light emitting diode chip configured to emit light having a peak wavelength in the range of about 390 nm to about 430 nm. In addition, "blue light" may refer to visible light having a wavelength in the range of about 430 nm to about 500 nm, and the "blue light emitting diode chip" refers to a light emitting diode chip configured to emit light having a peak wavelength in a range of about 430 nm to about 500 nm. Further, "green light" may refer to visible light having a wavelength in a range of about 500 nm to about 580 nm, and "red light" refers to visible light having a wavelength in a range of about 600 nm to about 680 nm.

FIG. 3 is a graph depicting a spectral power distribution of light emitted from a white light emitting device using a near-UV light emitting diode chip, and has an average color rendering index of 95 or more, according to color temperature. As shown in FIG. 3, it can be seen that the white light emitting device has low peaks in the wavelength band corresponding to blue light, unlike the graph shown in FIG. 2.

However, the near-UV light emitting diode chip has higher manufacturing costs than the blue light emitting diode chip. In addition, the white light emitting device using the near-UV light emitting diode chip requires the use of phosphors for emitting blue light, thereby providing relatively low light conversion efficiency. Moreover, when the white light emitting device using the near-UV light emitting diode chip includes phenyl-based silicone, as in the white light emitting device based on the blue light emitting diode chip, reliability of the device may be deteriorated due to the characteristics of light emitted from the near-UV light emitting diode chip, such as a yellowing phenomenon. Thus, the white light emitting device using the near-UV light emitting diode chip is required to use methyl-based silicone. However, the methyl-based silicone has lower strength than the phenyl-based silicone, thereby deteriorating the reliability of the device.

Hereinafter, exemplary embodiments of the invention will be described in detail with reference to the accompanying drawings.

Figure 4:
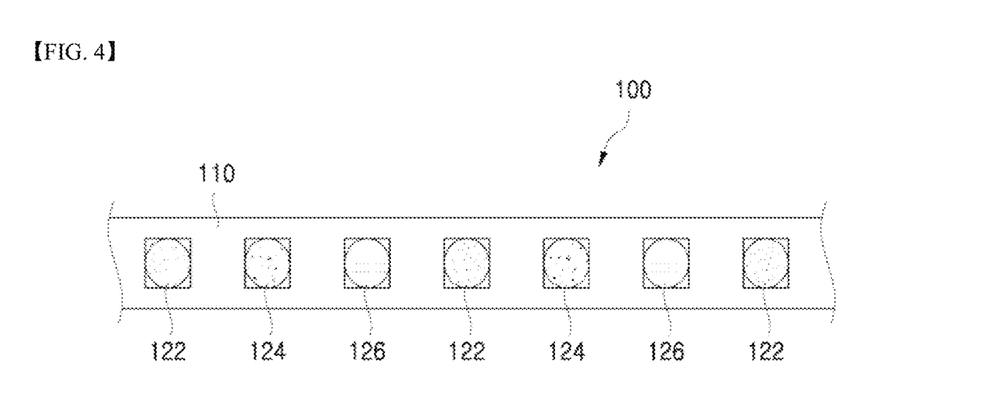
FIG. 4 is a schematic view of a light emitting device according to an exemplary embodiment.
Figure 5:
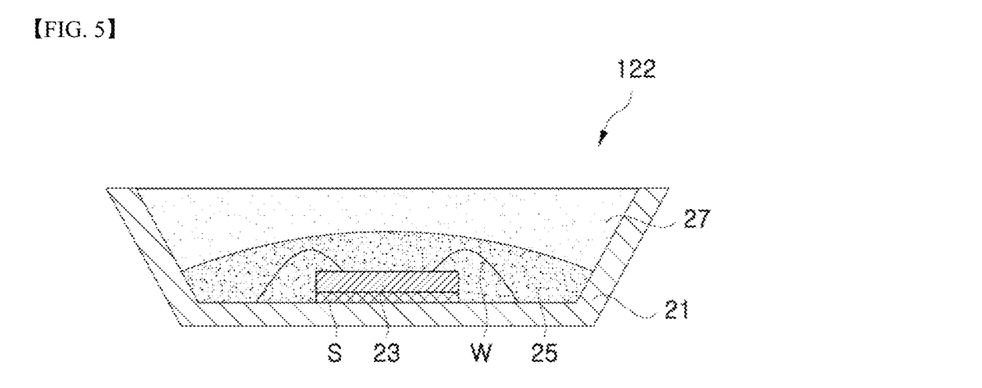
FIG. 5 is a schematic view of a light emitting diode chip in the light emitting device according to an exemplary embodiment.

FIG. 4 is a schematic view of a light emitting device according to an exemplary embodiment, and FIG. 5 is a schematic view of a light emitting diode chip in the light emitting device according to an exemplary embodiment.

Referring to FIG. 4, a light emitting device 100 according to an exemplary embodiment includes a base 110, a first light emitting portion, a second light emitting portion, and a third light emitting portion.

The first light emitting portion may be a blue light emitting portion 122, the second light emitting portion may be a green light emitting portion 124, and the third light emitting portion may be a red light emitting portion 126.

The blue light emitting portion 122, the green light emitting portion 124, and the red light emitting portion 126 may be mounted on the base 110. In some exemplary embodiments, the base 110 may be a printed circuit board including a circuit for supplying power to the blue light emitting portion 122, the green light emitting portion 124, and the red light emitting portion 126, and may be provided with an integrated circuit (IC) for supplying the power to the base 100, as needed.

The blue light emitting portion 122 may include a near-UV light emitting diode chip, and may emit blue light through wavelength conversion of near-UV light emitted from the near-UV light emitting diode chip. Details of the blue light emitting portion 122 will be described below.

The green light emitting portion 124 may include a near-UV light emitting diode chip or a blue light emitting diode chip, and may emit green light through wavelength conversion of light emitted from the near-UV or the blue light emitting diode chip.

The red light emitting portion 126 may include a near-UV light emitting diode chip or a blue light emitting diode chip, and may emit red light through wavelength conversion of light emitted from the near-UV or the blue light emitting diode chip.

In the illustrated exemplary embodiment, each of the blue light emitting portion 122, the green light emitting portion 124, and the red light emitting portion 126 may be provided in plural, and the blue light emitting portion 122, the green light emitting portion 124, and the red light emitting portion 126 may be sequentially arranged, as shown in FIG. 4, without being limited thereto. However, the inventive concepts are not limited thereto, and the blue light emitting portion 122, the green light emitting portion 124, and the red light emitting portion 126 may be arranged in other sequences. In addition, although FIG. 4 shows multiple blue light emitting portions 122, multiple green light emitting portions 124, and multiple red light emitting portions 126 being individually disposed on the base 110, in some exemplary embodiments, the multiple blue light emitting portions 122, the multiple green light emitting portions 124, and the multiple red light emitting portions 126 may be arranged in groups and be disposed on the base 110.

Next, details of the blue light emitting portion 122, the green light emitting portion 124, and the red light emitting portion 126 will be described in detail with reference to FIG. 5. Hereinafter, the light emitting portion will be described with reference to the blue light emitting portion 122 in FIG. 5.

Referring to FIG. 5, according to the illustrated exemplary embodiment, the blue light emitting portion 122 includes a housing 21, a light emitting diode chip 23, a wavelength conversion portion 25, and a molding portion 27.

The housing 21 receives the light emitting diode chip 23 therein, and may include at least one lead. The housing 21 may have a cavity that is open at one side thereof, and the light emitting diode chip 23 may be disposed inside the cavity.

The blue light emitting portion 122 may include the light emitting diode chip 23, which may be a near-UV light emitting diode chip disposed at a lower portion inside the cavity of the housing 21. The light emitting diode chip 23 may be bonded to the housing 21 by a bonding portion S, and may be electrically connected to at least one lead of the housing 21 by a wire W. The bonding portion S may include silver (Ag) pastes, for example, without being limited thereto.

The wavelength conversion portion 25 is disposed inside the cavity of the housing 21 to cover the light emitting diode chip 23. The wavelength conversion portion 25 may include at least one type of phosphor for wavelength conversion of near-UV light, which is emitted from the near-UV light emitting diode chip used in the blue light emitting portion 122, into blue light (for example, light in a wavelength band of 430 nm to 500 nm). According to the illustrated exemplary embodiment, BAM-based phosphors and/or halophosphate-based phosphors may be used as a phosphor for the wavelength conversion of near-UV light into blue light. For example, the phosphor for wavelength conversion of near-UV light into blue light may include at least one of $BaMgAl_{10}O_{17}:Mn^{2+}$, $BaMgAl_{12}O_{19}:Mn^{2+}$ and $Sr,Ca,Ba(PO_4)Cl:Eu^{2+}$.

The molding portion 27 is formed in the cavity of the housing 21 to cover the wavelength conversion portion 25. In the illustrated exemplary embodiment, the molding portion 27 may be formed of phenyl-based silicone.

Although the molding portion 27 is illustrated as covering the wavelength conversion portion 25 in FIG. 5, however, the inventive concepts are not limited thereto, and in some exemplary embodiments, the molding portion 27 may be integrally formed with the wavelength conversion portion 25.

According to the illustrated exemplary embodiment, the light emitting diode chip 23 of the blue light emitting portion 122 may be a lateral type light emitting diode chip. Alternatively, a vertical light emitting diode chip or a flip-chip type light emitting diode chip may be used as the light emitting diode chip 23.

In the green light emitting portion 124 according to an exemplary embodiment, the light emitting diode chip 23 may be a near-UV light emitting diode chip or a blue light emitting diode chip, and the wavelength conversion portion 25 may emit green light (for example, light in a wavelength band of 500 nm to 580 nm) through wavelength conversion of light emitted from the near-UV or the blue light emitting diode chip. As such, the wavelength conversion portion 25 may include at least one type of phosphor for wavelength conversion of near-UV light or blue light into green light. For example, LuAG, YAG, silicate, sulfide, and/or oxynitride-based phosphors may be used as a phosphor for wavelength conversion of near-UV light or blue light into green light. For example, the phosphor for wavelength conversion of near-UV light or blue light into green light may include at least one of LuAG ($Lu_3(Al,Gd)_5O_{12}:Ce^{3+}$), YAG ($Y_3(Al,Gd)_5O_{12}:Ce^{3+}$), Ga-LuAG ($(Lu,Ga)_3(Al,Gd)_5O_{12}:Ce^{3+}$), Ga-YAG ($(Ga,Y)_3(Al,Gd)_5O_{12}:Ce^{3+}$), LuYAG ($(Lu,Y)_3(Al,Gd)_5O_{12}:Ce^{3+}$), orthosilicate ($(Sr,Ba,Ca,Mg)_2SiO_4:Eu_{2+}$), oxynitride ($(Ba,Sr,Ca)Si_2O_2N_2:Eu^{2+}$), and thiogallate ($SrGa_2S_4:Eu^{2+}$).

In the red light emitting portion 126 according to an exemplary embodiment, the light emitting diode chip 23 may be a near-UV light emitting diode chip or a blue light emitting diode chip, and the wavelength conversion portion 25 may emit red light (for example, light in a wavelength band of 600 nm to 680 nm) through wavelength conversion of light emitted from the near-UV or the blue light emitting diode chip. As such, the wavelength conversion portion 25 may include at least one type of phosphor for wavelength conversion of near-UV light or blue light into red light. For example, CASN, sulfide, fluoride, and/or oxynitride phosphors may be used as a phosphor for wavelength conversion of near-UV light or blue light into red light. For example, the phosphor for wavelength conversion of near-UV light or blue light into red light may include at least one of CASN ($CaAlSiN_3:Eu^{2+}$), oxynitride ($(Ba,Sr,Ca)_2Si_5N_8:Eu^{2+}$), sulfide ($(Ca,Sr)S_2:Eu^{2+}$), and thiosilicate ($(Sr,Ca)_2SiS_4:Eu^{2+}$).

Figure 6:
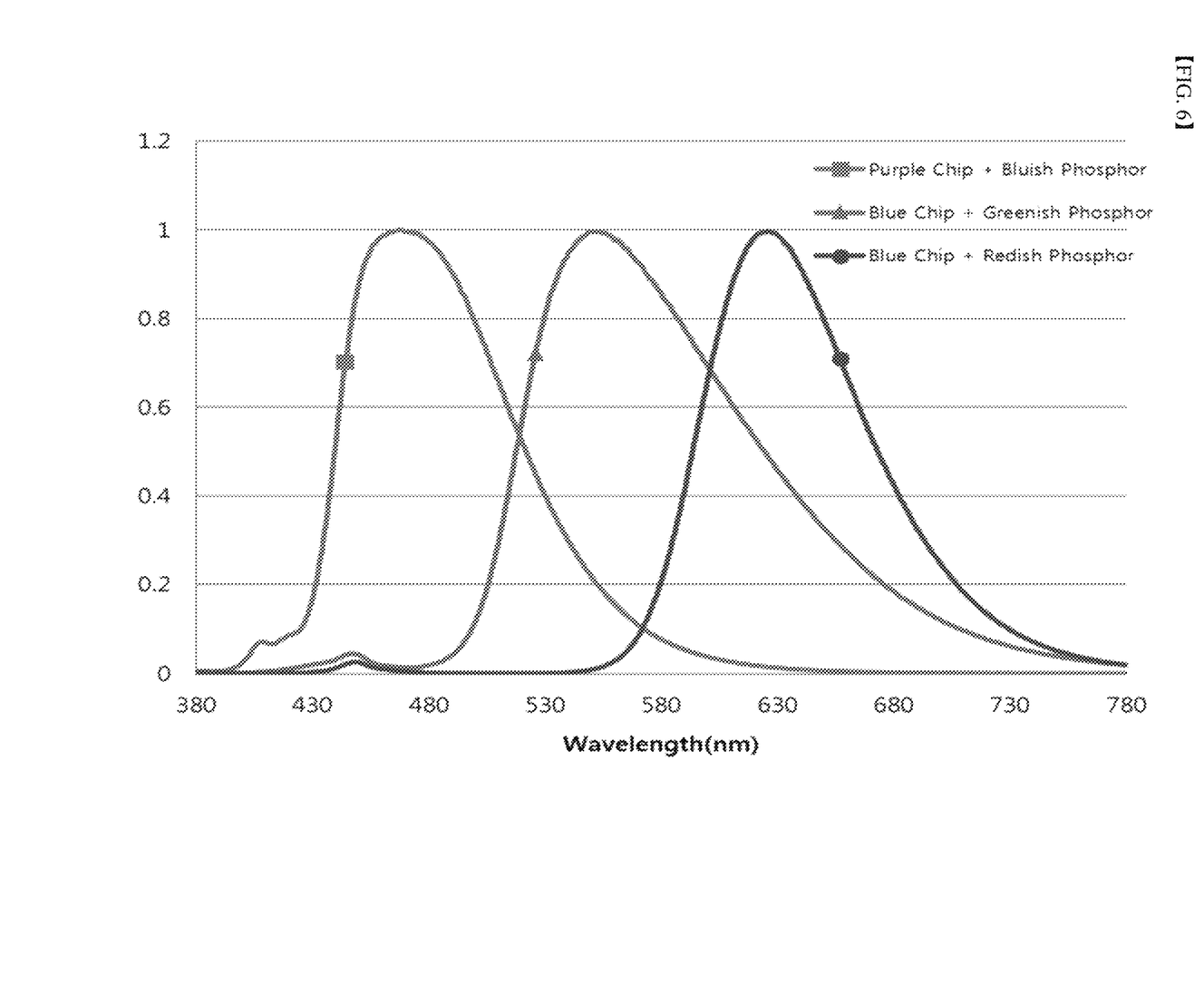
FIG. 6 is a graph depicting spectral power distributions of blue light, green light, and red light emitted from the light emitting device according to an exemplary embodiment.

FIG. 6 is a graph depicting spectral power distributions of blue light, green light, and red light emitted from the light emitting device according to an exemplary embodiment.

Referring to FIG. 6, in the spectral power distribution of blue light emitted from the blue light emitting portion 122, it can be seen that peak wavelength appear in the wavelength band of blue light. Since the blue light emitting portion 122 according to the illustrated exemplary embodiment employs the near-UV light emitting diode chip, some peak wavelengths are observed in the wavelength band of near-UV light.

In this spectral power distribution, the peak wavelengths in the wavelength band of near-UV light may have an intensity of about 0% to 20% of that of the peak wavelengths in the wavelength band of blue light. In some exemplary embodiments, the peak wavelengths in the wavelength band of near-UV light may have an intensity of about 0% to 10% of that of the peak wavelengths in the wavelength band of blue light. The intensity of the peak wavelengths in the wavelength band of near-UV light is lower than that of the peak wavelengths in the wavelength of blue light, because the wavelength conversion portion 25 that converts wavelength of light emitted from near-UV light emitting diode chip includes a relatively greater amount of phosphors to increase the wavelength conversion of near-UV light into blue light. As such, a separate color filter for shielding near-UV light may be omitted in the light emitting device according to the illustrated exemplary embodiment, thereby improving the luminous efficacy as compared with a light emitting device using the color filter. The intensity of the peak wavelengths in the wavelength band of near-UV light (about 380 nm to about 430 nm) emitted from the blue light emitting portion 122 may be regulated within the above range according to correlated color temperature information of sunlight.

Further, in the spectral power distribution of green light emitted from the green light emitting portion 124, it can be seen that peak wavelengths appear in the wavelength band of green light. In the illustrated exemplary embodiment, since the green light emitting portion 124 includes the blue light emitting diode chip, some peak wavelengths appear in the wavelength band of blue light. When the green light emitting portion 124 alternatively includes a near-UV light emitting diode chip, a peak wavelength may appear in the wavelength band of near-UV light.

In this spectral power distribution, the peak wavelengths in the wavelength band of near-UV light or blue light may have an intensity of about 0% to 20% of that of the peak wavelengths in the wavelength band of green light. In some exemplary embodiments, the peak wavelengths in the wavelength band of near-UV light or blue light have an intensity of about 0% to 10% of that of the peak wavelengths in the wavelength band of green light. The intensity of the peak wavelengths in the wavelength band of near-UV light or blue light is lower than the intensity of the peak wavelengths in the wavelength of green light, because the wavelength conversion portion 25 that converts wavelengths of light emitted from the near-UV or blue light emitting diode chip includes a relatively greater amount of phosphors to improve wavelength conversion of near-UV light or blue light into green light.

Further, in the spectral power distribution of red light emitted from the red light emitting portion 126, it can be seen that peak wavelengths appear in the wavelength band of red light. In the illustrated exemplary embodiment, since the red light emitting portion 126 employs the blue light emitting diode chip, some peak wavelengths appear in the wavelength band of blue light. When the red light emitting portion 126 alternatively employs a near-UV light emitting diode chip, a peak wavelength may appear in the wavelength band of near-UV light.

In this spectral power distribution, the peak wavelengths in the wavelength band of near-UV light or blue light may have an intensity of about 0% to 20% of that of the peak wavelengths in the wavelength band of red light. In some exemplary embodiments, the peak wavelengths in the wavelength band of near-UV light or blue light may have an intensity of about 0% to 10% of that of the peak wavelengths in the wavelength band of red light. The intensity of the peak wavelengths in the wavelength band of near-UV light or blue light is lower than the intensity of the peak wavelengths in the wavelength of red light, because the wavelength conversion portion 25 that converts wavelength of light emitted from the near-UV or blue light emitting diode chip includes a relatively greater amount of phosphors to improve wavelength conversion of near-UV light or blue light into red light.

Figure 7:
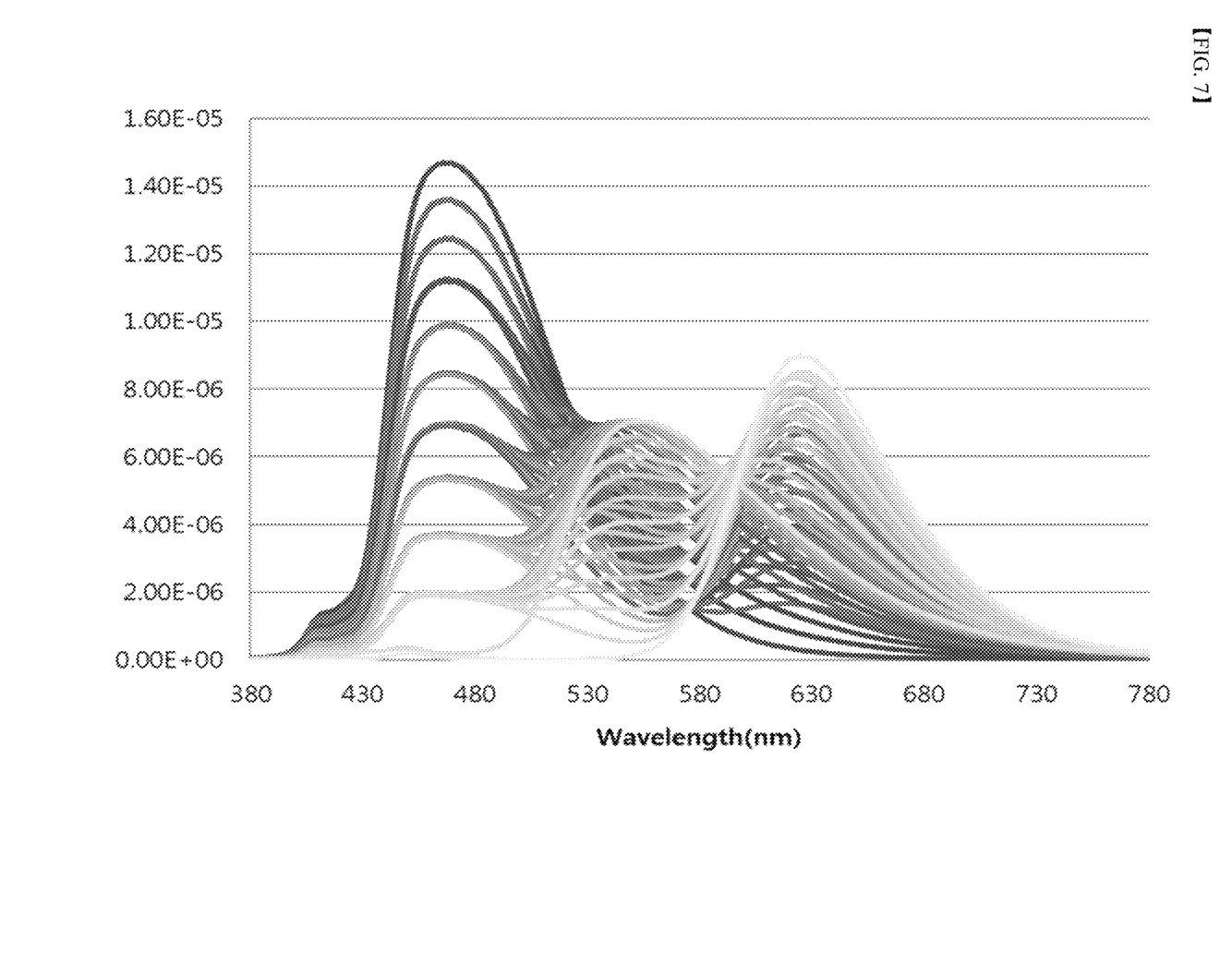
FIG. 7 is a graph depicting spectral power distributions of light emitted from the light emitting device according to an exemplary embodiment depending upon electric current supplied thereto.

FIG. 7 is a graph depicting spectral power distributions of light emitted from the light emitting device according to an exemplary embodiment depending upon condition of electric current supplied thereto.

According to the illustrated exemplary embodiment, each of the blue light emitting portion 122, the green light emitting portion 124, and the red light emitting portion 126 may be independently driven. In particular, anodes and cathodes of the blue light emitting portion 122, the green light emitting portion 124, and the red light emitting portion 126 may be individually electrically connected to a power source. The graph of FIG. 7 depicts spectral power distributions of light emitted from the light emitting device 100 through individual regulation of electric current supplied to the blue light emitting portion 122, the green light emitting portion 124, and the red light emitting portion 126. As shown in FIG. 7, it can be seen that the peak wavelengths in the wavelength bands of blue light, green light, and red light differ depending upon electric current supplied thereto. In addition, the intensity of the peak wavelengths in the wavelength band of about 380 nm to about 430 nm may be regulated according to correlated color temperature information of sunlight.

Figure 8:
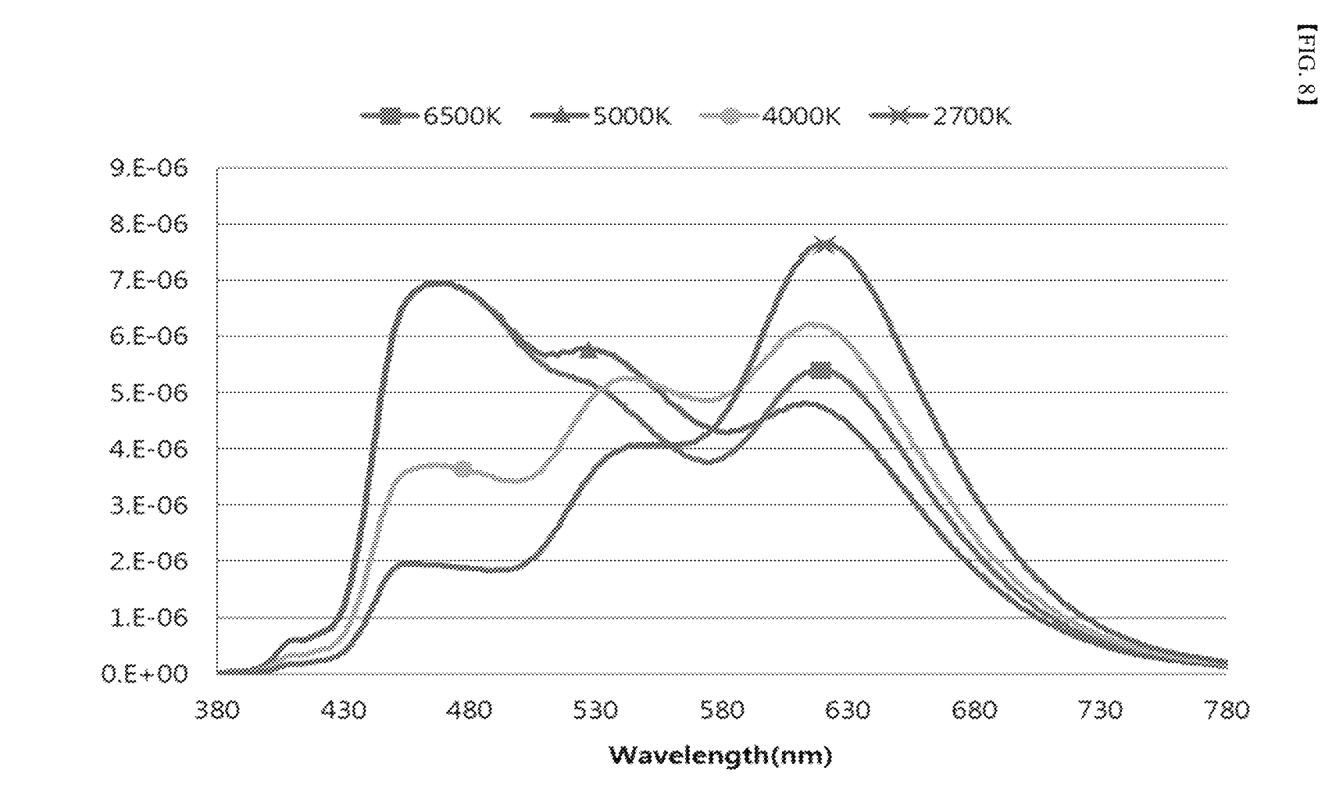
FIG. 8 is a graph depicting spectral power distributions of light emitted from the light emitting device according to an exemplary embodiment depending upon color temperature.

FIG. 8 is a graph depicting spectral power distributions of light emitted from the light emitting device according to an exemplary embodiment depending upon color temperature.

Referring to FIG. 8, spectral power distributions of white regions corresponding to 6,500K, 5,000K, 4,500K and 2,700K, which are representative color temperatures on CIE-1931 xy color coordinates regulated by the American National Standards Institute (ANSI), can be obtained by controlling electric current supplied to the blue light emitting portion 122, the green light emitting portion 124, and the red light emitting portion 126 of the light emitting device 100 according to the illustrated exemplary embodiment.

Comparing with the spectral power distribution of a white light emitting device using a conventional blue light emitting diode chip shown in FIG. 2, it can be seen that the graph of FIG. 8 exhibits a broader spectrum of the wavelength band of near-UV light or blue light. Further, it can be seen that the intensity of light emitted from the light emitting diode according to an exemplary embodiment is lowered to a substantially similar level to the intensity of the spectral power distribution of sunlight shown in FIG. 1.

Further, comparing the graph of FIG. 8 with the spectral power distribution of a conventional near-UV light emitting diode chip shown in FIG. 3, it can be seen that the graph of FIG. 8 exhibits lower intensity of light in the wavelength band of near-UV light, and a broader width of the wavelength band of blue light.

As such, the light emitting device 100 according to an exemplary embodiment exhibits a more uniform and continuous spectral power distribution of white light as compared to a conventional light emitting device.

Figure 9:
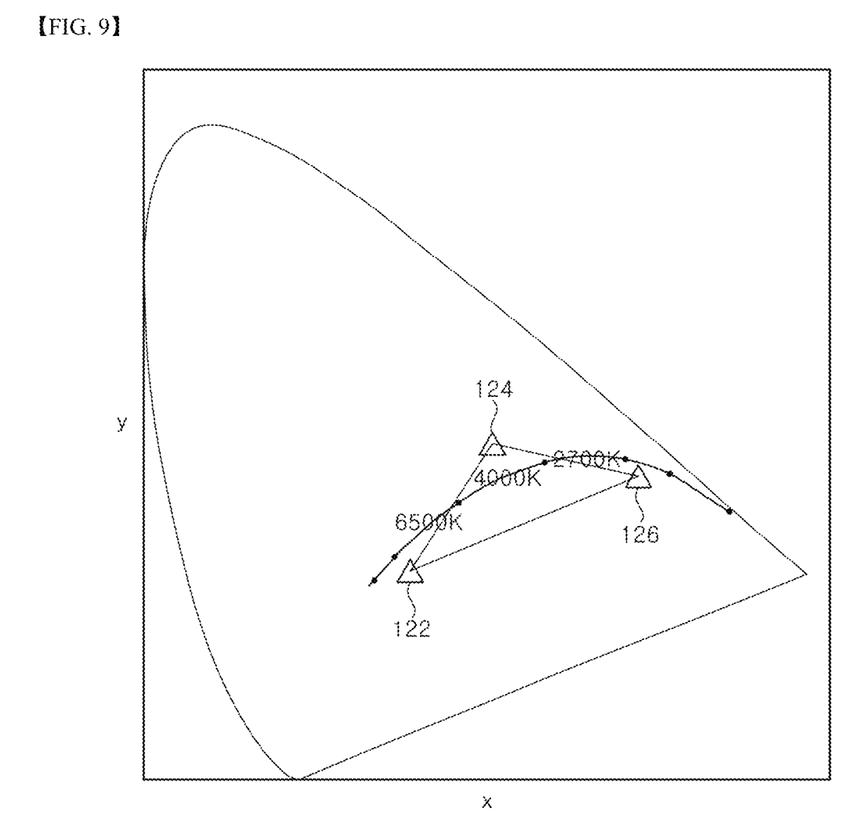
FIG. 9 shows schematic color coordinates of a light emitting device according to an exemplary embodiment.
Figure 10:
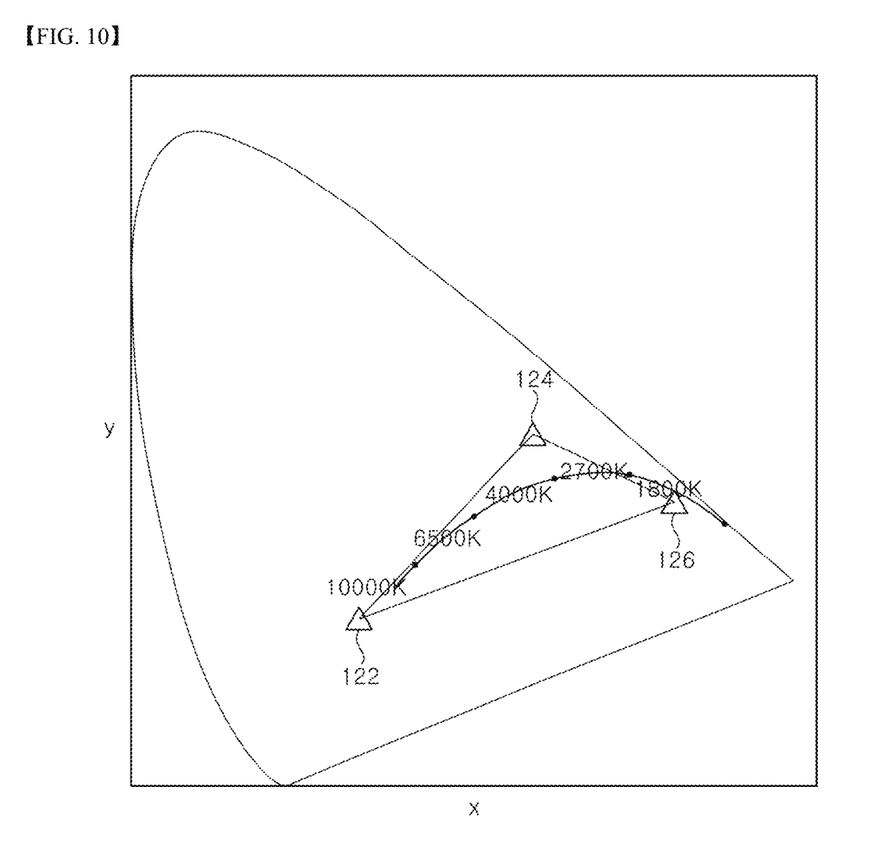
FIG. 10 shows schematic color coordinates of a light emitting device according to another exemplary embodiment.
Figure 11:
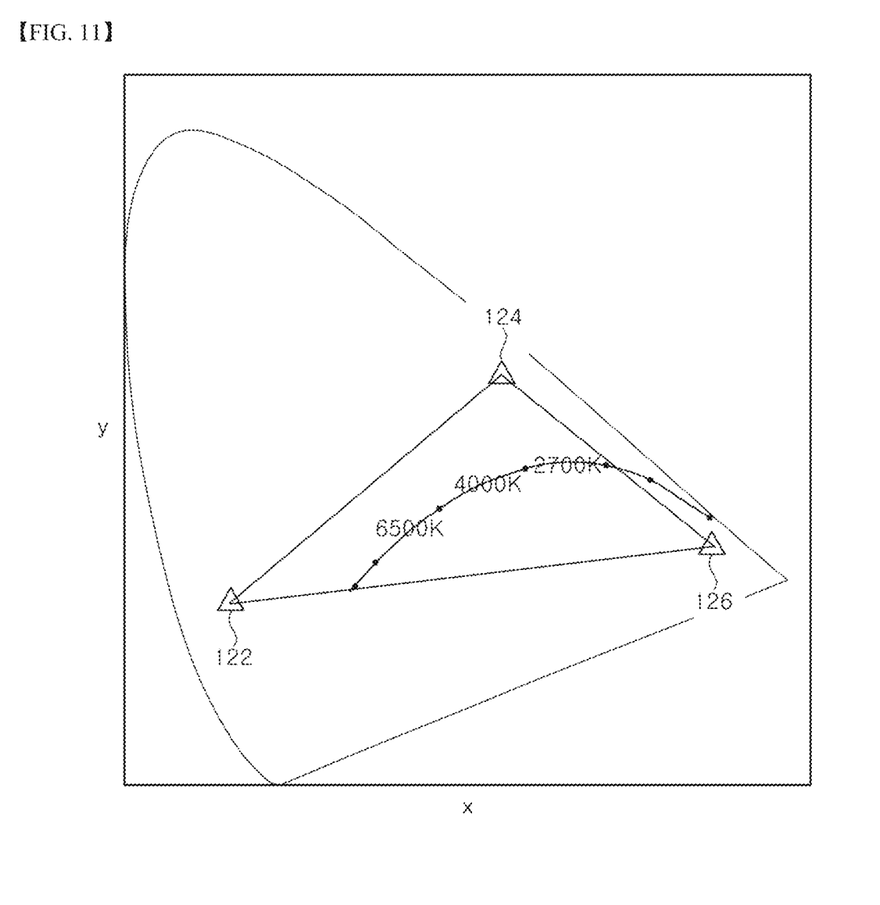
FIG. 11 shows schematic color coordinates of a light emitting device according to another exemplary embodiment.

FIG. 9 to FIG. 11 are schematic color coordinates of a light emitting device 100 according to an exemplary embodiment.

Referring to FIG. 9 to FIG. 11, a triangle is defined inside the color coordinates by the blue light emitting portion 122, the green light emitting portion 124, and the red light emitting portion 126, in which at least a portion of the Planckian locus is included in the triangle. The size of the triangle may be regulated by regulating the color coordinates of the blue light emitting portion 122, the green light emitting portion 124, and the red light emitting portion 126, thereby controlling the length of the Planckian locus in the triangle. FIG. 9 shows a triangle including the Planckian locus having a relatively short length, FIG. 10 shows a triangle including the Planckian locus having a relatively long length, and FIG. 11 shows a triangle defined by the color coordinates of the blue, green, and red light emitting portions 122, 124, 126 of FIG. 6.

As used herein, unless stated otherwise, the Planckian locus refers to the Planckian locus in the CIE-1931 color coordinate system regulated by American National Standards Institute (ANSI). The CIE-1931 color coordinate system can be easily converted into the 1976 coordinate system through simple numerical modification.

Light in a triangle, particularly light having a color temperature on the Planckian locus included in the triangle, can be realized by regulating the brightness of light emitted from the blue light emitting portion 122, the green light emitting portion 124, and the red light emitting portion 126.

The highest color temperature and the lowest color temperature on the Planckian locus included in the triangle may be used to control a color temperature of white light that can be displayed. In order to realize light similar to sunlight, the light emitting device may emit light having the highest color temperature of 5,000K or more and the lowest color temperature of 3,000K or less on the Planckian locus in the triangle defined by the color coordinates of the blue light emitting portion 122, the green light emitting portion 124 and the red light emitting portion 126. Furthermore, the highest color temperature may be 6,000K or more, specifically 6,500K or more, more specifically 10,000K or more, and the lowest color temperature may be 2,700K or less, specifically 1,800K or less.

The light emitting device 100 according to the illustrated exemplary embodiment includes the blue light emitting portion 122, the green light emitting portion 124, and the red light emitting portion 126, and may emit white light corresponding to color temperatures of 6,500K, 5,000K, 4,500K, and 2,700K through regulation of electric current supplied to each of the blue light emitting portion 122, the green light emitting portion 124, and the red light emitting portion 126. Further, upon emission of light with the same brightness, the light emitting device 100 may emit light having the color temperature of white light by activating each of the blue light emitting portion 122, the green light emitting portion 124, and the red light emitting portion 126. In this manner, the number of blue light emitting portions 122, green light emitting portions 124, and red light emitting portions 126 included in the light emitting device 100 may be reduced, as compared with the case of realizing color temperatures of 6,500K, 4,500K and 2,700K using white light emitting diodes emitting light having color temperatures of 6,500K and 2,700K.

For example, a light emitting device may display white light having a luminance of 630 to 640 lm by using white light emitting diodes emitting light having color temperatures of 6,500K and 2,700K. In this case, a near-UV light emitting diode chip has an operating voltage of about 3V, and one white light emitting diode for each color temperature has a luminous efficacy of 120 lm/W, and thus, a white light emitting diode may have a total level of 5.3 W. Accordingly, when electric current applied to each white light emitting diode is 62 mA, a total of 27 white light emitting diodes may be required to realize a luminance of 630 to 640 lm. As such, a total of 54 white light emitting diodes may be required for realizing each of 6,500K and 2,700K.

According to an exemplary embodiment, since the light emitting device 100 regulates the color temperature of mixed white light based on electric current supplied to the blue light emitting portion 122, the green light emitting portion 124, and the red light emitting portion 126, only nine blue light emitting portions 122, nine green light emitting portions 124, and nine red light emitting portions 126 may be used. Accordingly, the light emitting device 100 according to an exemplary embodiment substantially reduces the number of light emitting portions, as compared with a conventional light emitting device, while emitting light with the same brightness.

According to an exemplary embodiment, electric current supplied to the blue light emitting portion 122, the green light emitting portion 124, and the red light emitting portion 126 may be controlled by a pulse width modulation (PWM) or TRIAC type dimming technique.

As used herein, pulse width modulation may refer to a modulation process of changing the width of a pulse according to the magnitude of a modulation signal. For example, when the amplitude of a signal wave is large, the width of the pulse becomes wider, and when the amplitude of the signal wave is small, the width of the pulse becomes narrow. Accordingly, the brightness of each of the blue light emitting portion 122, the green light emitting portion 124, and the red light emitting portion 126 can be controlled by controlling the pulse widths of electric current supplied to the blue light emitting portion 122, the green light emitting portion 124, and the red light emitting portion 126, thereby achieving color temperature control.

The light emitting device 100 according to an exemplary embodiment may further include a database containing information corresponding to the morning, lunch, and evening spectra of sunlight. As such, the light emitting device 100 may implement an emission spectrum according to a corresponding time zone of the spectrum of sunlight stored in the database.

For example, the light emitting device 100 may emit light having a spectrum that coincides with a morning spectrum of sunlight in the morning, emit light having a spectrum that coincides with a lunch spectrum of sunlight at lunchtime, and emit light having a spectrum that coincides with an evening spectrum of sunlight in the evening.

Such time-based spectrum control may be changed according to user selection. For example, if a user prefers the morning spectrum of sunlight, the light emitting device 100 may emit light having a spectrum that coincides with a morning spectrum of sunlight continuously. As another example, if a user prefers the evening spectrum of sunlight, the light emitting device 100 may emit light having a spectrum that coincides with an evening spectrum of sunlight continuously. The light emitting device may allow a user to selectively use the spectrum control at breakfast and lunch only, at morning and evening only, or at lunch and dinner, as needed. Further, the light emitting device may allow control of the driving time of the morning, lunch, and evening spectra according to user preset time.

Such spectrum control may be properly performed not only by a timer included in the light emitting device 100, but also by user selection through a user interface.

When controlled by the timer, the emission spectrum of the light emitting device 100 may be controlled using the stored spectrum data of sunlight according to time of the timer. For example, when a user presets the morning spectrum from 6:00 AM to 11:59 PM, the lunch spectrum from 12:00 PM to 5:59 PM, and the evening spectrum from 6:00 PM to 5:59 AM in the next morning, the emission spectrum of the light emitting device 100 may be controlled accordingly.

When controlled by the user interface, the emission spectrum of the light emitting device 100 may be controlled using a control panel of the light emitting device 100 or a separate remote controller separated from the control panel.

Exemplary embodiments may provide a light emitting device that includes a blue light emitting portion, a green light emitting portion, and a red light emitting portion to emit white light having a similar spectral power distribution to that of sunlight.

The light emitting device according to exemplary embodiments may regulate the color temperature of white light emitted therefrom through regulation of electric current applied to the blue light emitting portion, the green light emitting portion, and the red light emitting portion, thereby emitting white light that similar to sunlight and has a color temperature varying over time or according to a user preset value.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

The invention claimed is:

1. A light emitting device comprising:
a blue light emitting portion configured to emit blue light;
a green light emitting portion configured to emit green light; and
a red light emitting portion configured to emit red light, wherein:
the blue light emitting portion comprises a first light emitting diode chip and a first wavelength conversion portion for wavelength conversion of light emitted from the first light emitting diode chip, the blue light emitted from the blue light emitting portion includes a first peak wavelength in a range of 390 nm to 430 nm and a second peak wavelength in a range of 430 nm to 500 nm;
the green light emitting portion comprises a second light emitting diode chip and a second wavelength conversion portion for wavelength conversion of light emitted from the second light emitting diode chip, the green light emitted from the green light emitting portion includes a third peak wavelength in a range of 390 nm to 500 nm and a fourth peak wavelength in a range of 500 nm to 580 nm;
the red light emitting portion comprises a third light emitting diode chip and a third wavelength conversion portion for wavelength conversion of light emitted from the third light emitting diode chip, the red light emitted from the red light emitting portion includes a fifth peak wavelength in a range of 390 nm to 500 nm and a sixth peak wavelength in a range of 600 nm to 680 nm; and
the light emitting device is configured to emit white light implemented by the blue light of the blue light emitting portion, the green light of the green light emitting portion, and the red light of the red light emitting portion.

2. The light emitting device according to claim 1, wherein:
the blue light emitting portion further comprises a housing on which the first light emitting diode chip is mounted; and
the first wavelength conversion portion covers the first light emitting diode chip, and comprises a phosphor to emit the blue light through wavelength conversion of light emitted from the first light emitting diode chip.

3. The light emitting device according to claim 2, wherein the phosphor comprises at least one of $BaMgAl_{10}O_{17}:Mn^{2+}$, $BaMgAl_{12}O_{19}:Mn^{2+}$, and $Sr,Ca,Ba(PO_4)Cl:Eu^{2+}$.

4. The light emitting device according to claim 1, wherein:
the green light emitting portion further comprises a housing on which the second light emitting diode chip is mounted; and
the second wavelength conversion portion covers the second light emitting diode chip and comprises a phosphor to emit green light through wavelength conversion of light emitted from the second light emitting diode chip.

5. The light emitting device according to claim 4, wherein an intensity of the third peak wavelength is in a range of 0% to 20% of an intensity of the fourth peak wavelength.

6. The light emitting device according to claim 4, wherein the phosphor comprises at least one of LuAG ($Lu_3(Al,Gd)_5O_{12}:Ce^{3+}$), YAG ($Y_3(Al,Gd)_5O_{12}:Ce^{3+}$), Ga-LuAG ($(Lu,Ga)_3(Al,Gd)_5O_{12}:Ce^{3+}$, Ga-YAG ($(Ga,Y)_3(Al,Gd)_5O_{12}:Ce^{3+}$), LuYAG ($(Lu,Y)_3(Al,Gd)_5O_{12}:Ce^{3+}$), orthosilicate ($(Sr,Ba,Ca,Mg)_2SiO_4:Eu^{2+}$), oxynitride ($(Ba,Sr,Ca)Si_2O_2N_2:Eu^{2+}$), and thiogallate ($SrGa_2S_4:Eu^{2+}$).

7. The light emitting device according to claim 1, wherein:
the red light emitting portion further comprises a housing on which the third light emitting diode chip is mounted; and
the third wavelength conversion portion covers the third light emitting diode chip and comprises a phosphor to emit red light through wavelength conversion of light emitted from the third light emitting diode chip.

8. The light emitting device according to claim 7, wherein an intensity of the fifth peak wavelength is in a range of 0% to 20% of an intensity of the sixth peak wavelength.

9. The light emitting device according to claim 6, wherein the phosphor comprises at least one of CASN ($CaAlSiN_3:Eu^{2+}$), oxynitride ($(Ba,Sr,Ca)_2Si_5N_8:Eu^{2+}$), sulfide ($(Ca,Sr)S_2:Eu^{2+}$), and thiosilicate ($(Sr,Ca)_2SiS_4:Eu^{2+}$).

10. The light emitting device according to claim 1, wherein:
a triangular region defined by color coordinates of the blue light emitting portion, the green light emitting portion, and the red light emitting portion comprises at least part of the Planckian locus therein;
the highest color temperature on the Planckian locus in the triangular region is 5,000 K; and
the lowest color temperature on the Planckian locus in the triangular region is 3,000K or less.

11. The light emitting device according to claim 10, wherein the highest color temperature is 6,000 K or more, and the lowest color temperature is 2,700 K or less.

12. The light emitting device according to claim 11, wherein the highest color temperature is 6,500 K or more.

13. The light emitting device according to claim 12, wherein the highest color temperature is 6,500 K or more, and the lowest color temperature is 1,800 K or less.

14. The light emitting device according to claim 10, wherein:
an intensity of the third peak wavelength is in a range of 0% to 20% of an intensity of the fourth peak wavelength; and
an intensity of the fifth peak wavelength is in a range of 0% to 20% of an intensity of the sixth peak wavelength.

15. The light emitting device according to claim 1, wherein each of blue light emitting portion, green light emitting portion, and red light emitting portion are formed in plural.

16. The light emitting device according to claim 15, further comprising a base,
wherein the blue, green, and red light emitting portions are arranged on the base.

17. The light emitting device according to claim 16, further comprising an integrated circuit (IC) disposed on the base.

18. The light emitting device according to claim 16, wherein the light emitting device is configured to emit light based on spectrum information of sunlight stored in a database.

19. The light emitting device according to claim 18, further comprising a timer,
wherein the light emitting device is configured to emit light based on the stored spectrum information of sunlight according to time of the timer.

20. The light emitting device according to claim 18, wherein the light emitting device is configured to be controlled by a user interface.

* * * * *